US009252142B2

United States Patent
Zhu et al.

(10) Patent No.: US 9,252,142 B2
(45) Date of Patent: Feb. 2, 2016

(54) INTEGRATED CIRCUITS INCLUDING A RESISTANCE ELEMENT AND GATE-LAST TECHNIQUES FOR FORMING THE INTEGRATED CIRCUITS

(71) Applicant: GLOBALFOUNDRIES Singapore Pte. Ltd., Singapore (SG)

(72) Inventors: Ming Zhu, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/141,530

(22) Filed: Dec. 27, 2013

(65) Prior Publication Data
US 2015/0187863 A1    Jul. 2, 2015

(51) Int. Cl.
| | |
|---|---|
| *H01L 29/66* | (2006.01) |
| *H01L 27/06* | (2006.01) |
| *H01L 21/28* | (2006.01) |
| *H01L 49/02* | (2006.01) |

(52) U.S. Cl.
CPC ...... *H01L 27/0629* (2013.01); *H01L 21/28123* (2013.01); *H01L 28/22* (2013.01); *H01L 28/24* (2013.01); *H01L 29/66545* (2013.01)

(58) Field of Classification Search
CPC .............. H01L 21/823842; H01L 29/66545; H01L 28/22; H01L 28/24
USPC ............ 257/380, 538, 410, 77, 369, 48; 338/314
See application file for complete search history.

(56) References Cited

U.S. PATENT DOCUMENTS

| | | | |
|---|---|---|---|
| 6,069,063 A | 5/2000 | Chang et al. | |
| 2011/0057267 A1* | 3/2011 | Chuang et al. | 257/380 |
| 2013/0049168 A1* | 2/2013 | Yang et al. | 257/538 |

FOREIGN PATENT DOCUMENTS

EP    2434530 A2    3/2012

* cited by examiner

*Primary Examiner* — Kenneth Parker
*Assistant Examiner* — Bo Fan
(74) *Attorney, Agent, or Firm* — Ingrassia Fisher & Lorenz, P.C.

(57) ABSTRACT

Integrated circuits with a resistance element and gate-last techniques for forming the integrated circuits are provided. An exemplary technique includes providing a semiconductor substrate that includes a shallow trench isolation (STI) structure disposed therein. A dummy gate electrode structure is patterned overlying semiconductor material of the semiconductor substrate, and a resistor structure is patterned overlying the STI structure. The dummy gate electrode structure and the resistor structure include a dummy layer overlying a metal capping layer. A gate dielectric layer underlies the metal capping layer. An interlayer dielectric layer is formed overlying the semiconductor substrate and the STI structure. End terminal recesses for the resistance element are concurrently patterned through the dummy layer of the resistor structure along with removing the dummy layer of the dummy gate electrode structure to form a gate electrode recess. Metal gate material is deposited in the end terminal recesses and a gate electrode recess.

18 Claims, 5 Drawing Sheets

US 9,252,142 B2

INTEGRATED CIRCUITS INCLUDING A RESISTANCE ELEMENT AND GATE-LAST TECHNIQUES FOR FORMING THE INTEGRATED CIRCUITS

TECHNICAL FIELD

The technical field generally relates to integrated circuits that include a resistance element and techniques for forming the integrated circuits. More particularly, the technical field relates to integrated circuits that include a resistance element and gate-last techniques for forming the integrated circuits.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

Traditionally, the gate electrode is formed from a semiconductor material such as polycrystalline silicon, commonly referred to as "polysilicon". However, due to polysilicon depletion and threshold voltage shifts attributable to boron penetration into the channel region that severely degrade device performance, the semiconductor industry has begun replacing at least portions of polysilicon gate electrodes with metal gate electrodes. Replacement of polysilicon with a metal gate electrode solves both the boron penetration and the polysilicon depletion issues.

In addition to MOS transistors, integrated circuits commonly include various other devices such as, but not limited to, resistors, capacitors, memory devices, or the like. Polysilicon resistors may be formed in accordance with gate-first high-k metal gate (HKMG) fabrication techniques. In accordance with the gate-first HKMG techniques, resistors are formed with an appropriate dopant profile to establish a pre-determined resistivity for the polysilicon resistors, and the polysilicon resistors may be formed independent from gate electrodes of transistors. However, with gate-last HKMG techniques, dummy polysilicon structures are formed followed by front-end-of-line (FEOL) fabrication techniques to form source and drain regions for the transistors, with the dummy polysilicon structures removed and with the resulting gap filled with an appropriate material to form a gate electrode. Due to the removal of dummy polysilicon structures in gate-last HKMG techniques, doped polysilicon resistors formed in accordance with gate-first techniques cannot be formed in accordance with gate-last HKMG techniques. Further, undoped polysilicon has too high of a resistivity to be employed as a resistor itself.

Accordingly, it is desirable to provide integrated circuits and gate-last HKMG techniques for forming integrated circuits that include a resistor. Further, it is desirable to provide the gate-last HKMG techniques that enable the integrated circuits to be formed with the resistor without addition of further fabrication stages. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits including a resistance element and gate-last techniques for forming integrated circuits that are provided herein. In an embodiment, a gate-last technique for forming an integrated circuit that includes a resistance element includes providing a semiconductor substrate that includes a shallow trench isolation structure disposed in the semiconductor substrate. A dummy gate electrode structure is patterned overlying semiconductor material of the semiconductor substrate, and a resistor structure is patterned overlying the shallow trench isolation structure. The dummy gate electrode structure and the resistor structure include a dummy layer overlying a metal capping layer. A gate dielectric layer underlies the metal capping layer. An interlayer dielectric layer is formed overlying the semiconductor substrate and the shallow trench isolation structure, between the dummy gate electrode structure and the resistor structure. End terminal recesses for the resistance element are concurrently patterned through the dummy layer of the resistor structure along with removing the dummy layer of the dummy gate electrode structure to form a gate electrode recess. Metal gate material is deposited in the end terminal recesses and the gate electrode recess to form end terminals for the resistance element and a gate electrode, respectively.

In another embodiment, a gate-last technique for forming an integrated circuit that includes a resistance element includes providing a semiconductor substrate that includes an N-type well, a P-type well, and a shallow trench isolation structure disposed in the semiconductor substrate. A first dummy gate electrode structure is patterned overlying the N-type well, a second dummy gate electrode structure is patterned overlying the P-type well, and a resistor structure is patterned overlying the shallow trench isolation structure. The first dummy gate electrode structure, the second dummy gate electrode structure, and the resistor structure include a dummy layer overlying a metal capping layer and a gate dielectric layer underlying the metal capping layer. An interlayer dielectric layer is formed overlying the semiconductor substrate and the shallow trench isolation structure, between the first dummy gate electrode structure and the second dummy gate electrode structure and between the dummy gate electrode structures and the resistor structure. A first region of the resistor structure is masked with a first mask. Second regions of the resistor structure on either side of the first region remain unmasked. Portions of the dummy layer in the second regions are removed to form the end terminal recesses with the metal capping layer exposed in the end terminal recesses. The dummy layer of one of the first dummy gate electrode structure or the second dummy gate electrode structure is removed to form a gate electrode recess. A first metal gate material is deposited in the end terminal recesses and the gate electrode recess to form end terminals for the resistance element and a gate electrode, respectively.

In another embodiment, an integrated circuit includes a semiconductor substrate including a shallow trench isolation structure disposed in the semiconductor substrate. A gate electrode structure overlies semiconductor material of the semiconductor substrate and a resistance element is disposed over the shallow trench isolation structure. The gate electrode structure and the resistance element include a metal capping layer and a gate dielectric layer underlying the metal capping layer. The metal capping layer of the gate electrode structure and the metal capping layer of the resistance element are the same material. An interlayer dielectric layer is disposed over the semiconductor substrate and the shallow trench isolation structure, between the gate electrode structure and the resistance element. The resistance element includes end terminals disposed in electrical communication with the metal capping layer of the resistance element. The gate electrode structure includes a gate electrode in electrical communication with the metal capping layer of the gate electrode structure. The end terminals and the gate electrode are the same material.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Integrated circuits that include a resistance element and gate-last techniques for forming the integrated circuits are provided herein. In accordance with the gate-last techniques described herein, resistance elements can be formed using a metal capping layer that overlies a gate dielectric layer and that is employed for the gate electrode structure. In particular, during gate electrode structure formation in accordance with conventional gate-last techniques, a dummy gate electrode structure may be formed overlying a well in a semiconductor substrate, with the dummy gate electrode structure including a dummy layer that overlies the metal capping layer and a gate dielectric layer underlying the metal capping layer. Additionally, a resistor structure may be formed at the same time as the dummy gate electrode structure that includes the same layers as the dummy gate electrode structure. Whereas the metal capping layer ultimately becomes part of the gate electrode structure, the metal capping layer may be employed as a resistance layer. Further, end terminal recesses may be formed through the dummy layer of the resistor structure concurrent with removal of the dummy layer of the dummy gate electrode structure to form a gate electrode recess. A gate electrode may be formed in the gate electrode recess, and end terminals may be formed in the end terminal recesses from the same material as the gate electrode. As such, in accordance with the gate-last techniques described herein, the resistance element may be formed along with the gate electrode without addition of further fabrication stages.

Figure 1:
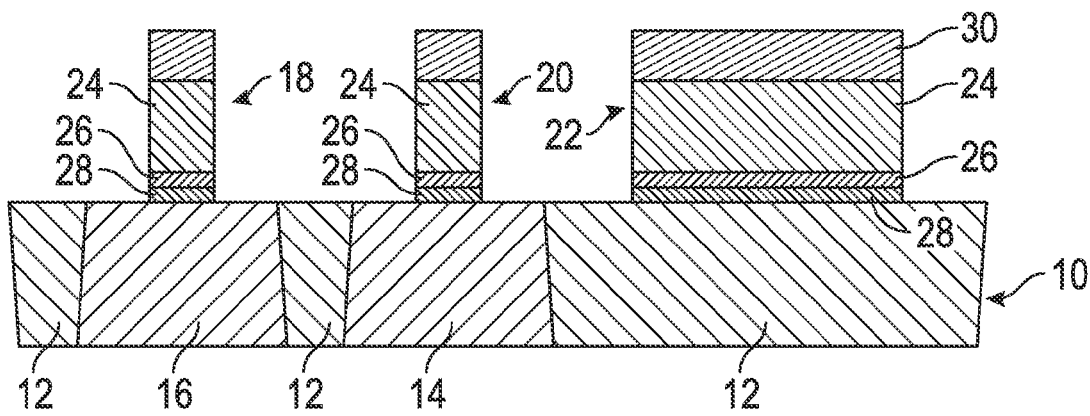
FIGS. 1-8 illustrate, in cross section, a gate-last technique for forming an integrated circuit including a resistance element in accordance with an exemplary embodiment.

An exemplary method of forming a semiconductor device will now be described with reference to FIGS. 1-8. Referring to FIG. 1, a semiconductor substrate 10 is provided. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an embodiment, the semiconductor material is a silicon substrate. The silicon substrate may be a bulk silicon wafer, or may be a thin layer of silicon on an insulating layer (commonly known as silicon-on-insulator or SOI) that, in turn, is supported by a carrier wafer.

Referring again to FIG. 1, the semiconductor substrate 10 is provided including a STI structure 12 disposed therein. In accordance with an embodiment, the STI structure 12 is formed in the semiconductor substrate 10, which may include wells 14, 16 that are formed through conventional fabrication techniques. In the illustration of FIG. 1, three STI structures 12 are formed, although it is to be appreciated that numerous STI structures 12 may be formed in the integrated circuit and various networks of STI structures 12 may be formed in accordance with conventional integrated circuit design. The wells 14, 16 have a dopant concentration, or a concentration of conductivity-determining ions, and the conductivity-determining ions may be P-type or N-type conductivity-determining ions, depending upon whether a PMOS transistor or NMOS transistor is to be formed. Typical N-type conductivity-determining ions include, but are not limited to, phosphorus, arsenic, antimony, and combinations thereof. Typical P-type conductivity determining ions include, but are not limited to, boron, aluminum, gallium, indium, and combinations thereof. In an embodiment and as shown in the Figures, the semiconductor substrate 10 includes a P-type well 14 that includes P-type conductivity-determining ions, and an N-type well 16 that includes N-type conductivity-determining ions. Each well 14, 16 contains opposite conductivity determining ions from a source region and a drain region of transistors that are to be formed therein. For example, the P-type well 14 may be employed when the source region and drain region for a transistor include N-type conductivity-determining ions, and the N-type well 16 may be employed when the source region and drain region for a transistor include P-type conductivity-determining ions.

Referring again to FIG. 1, a dummy gate electrode structure 18 is patterned overlying semiconductor material of the semiconductor substrate 10, and a resistor structure 22 is patterned overlying the shallow trench isolation structure 12. The term "dummy", as referred to herein, means a structure or layer at least a portion of which is removed and replaced with other material during integrated circuit fabrication. In embodiments and as shown in FIG. 1, numerous dummy gate electrode structures 18, 20 are patterned for later formation of gate electrodes through conventional gate-last formation techniques. In particular, as shown in FIG. 1 for illustrative purposes, a first dummy gate electrode structure 18 is patterned overlying the N-type well 16 and a second dummy gate electrode structure 20 is patterned overlying the P-type well 14. As referred to herein, "first dummy gate electrode structure" corresponds to all dummy gate electrode structures formed overlying N-type wells, and "second dummy gate electrode structure" refers to all dummy gate electrode structures formed overlying P-type wells, although only a single first dummy gate electrode structure 18 and a single second dummy gate electrode structure 20 are shown in the Figures for illustrative purposes.

The first dummy gate electrode structure 18, the second dummy gate electrode structure 20, and the resistor structure 22 may all be patterned through a single patterning procedure. In this regard, the resistor structure 22 may be patterned concurrently with patterning of the first dummy gate electrode structure 18 and the second dummy gate electrode structure 20 without adding any further stages to conventional dummy gate electrode structure formation. In particular, patterning of the first dummy gate electrode structure 18, the second dummy gate electrode structure 20, and the resistor structure 22 may be conducted by first patterning a dummy gate mask 30, followed by transferring the pattern in the dummy gate mask 30 into underlying layers using appropriate etchants that are selective to the particular materials of various layers 24, 26, 28 in the dummy gate electrode structures 18, 20 and the resistor structure 22, with the layers 24, 26, 28 described in further detail below. The dummy gate mask may include conventional hard mask materials such as titanium nitride.

The dummy gate electrode structures 18, 20 and the resistor structure 22 all include a dummy layer 24 that overlies a metal capping layer 26 and a gate dielectric layer 28 that underlies the metal capping layer 26, and the respective layers 24, 26, 28 may be formed through conventional blanket-deposition techniques overlying the semiconductor substrate followed by patterning as described above. The dummy layer 24 may be any sacrificial material including, but not limited to, a deposited silicon oxide, silicon nitride, silicon oxynitride, polycrystalline silicon, amorphous silicon, amorphous carbon (a-C), and a carbon-doped silica (SiCOH). It is to be appreciated that a particular type of material for the dummy layer 24 depends upon materials chosen for other structures that are present during selective removal of the dummy layer 24. In an embodiment, the dummy layer 24 includes polycrystalline silicon. The metal capping layer 26 may include any conventional capping material employed in metal gates as a capping material over the gate dielectric layer 28. Suitable materials for the metal capping layer 26 include middle gap materials, which do not materially impact final work function of the gate electrode. Examples of suitable middle gap materials include, but are not limited to, titanium nitride, tantalum nitride, and the like. The gate dielectric layer 28 may include a high-k material. As referred to herein, "high-k material", or high dielectric constant material, is a material that has a dielectric constant that is greater than silicon (dielectric constant of 3.9). Examples of suitable high-k dielectric materials include, but are not limited to, hafnium oxide, lanthanum oxide, zirconium oxide, tungsten oxide, iridium oxide, aluminum oxide, and the like. Although not shown in the Figures, conventional front-end-of-line fabrication techniques may be conducted with the dummy gate electrode structures 18, 20 and the resistor structure 22 in place, with source/drain formation, silicidation, and other conventional FEOL techniques possible.

Figure 2:
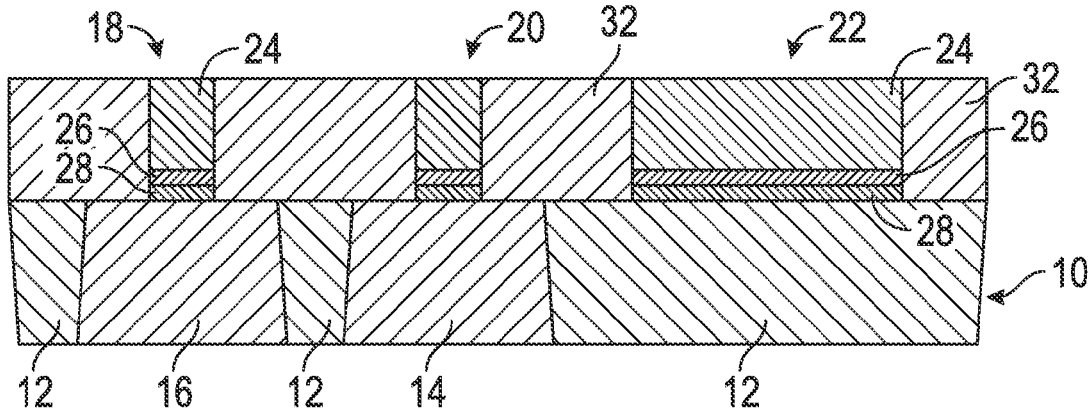

Referring to FIG. 2, an interlayer dielectric layer 32 is formed overlying the semiconductor substrate 10 and the shallow trench isolation structure 12, between the first dummy gate electrode structure 18 and the second dummy gate electrode structure 20 and between the dummy gate electrode structures 18, 20 and the resistor structure 22. For purposes of the instant application, the "interlayer dielectric layer" refers to a layer or layers of dielectric material that are formed during back-end-of-line (BEOL) fabrication and that at least partially remain in the integrated circuit after fabrication. The interlayer dielectric layer includes material that exhibits different etch selectivity in at least one type of etchant as compared to the dummy layer to enable selective etching of the dummy layer without materially etching the interlayer dielectric layer 32 during dummy gate pull, as described in further detail below. In embodiments, the interlayer dielectric layer 32 can be a low-k or ultra-low k material such as an oxide. As referred to herein, "low k" material also encompasses ultra low-k, extremely low-k, or any other low-k material as understood in the art, which materials are particularly useful in dielectric layers of integrated circuits. One specific example of a suitable oxide is silicon oxide formed through high density plasma deposition. Alternatively, the interlayer dielectric material may be a silicon nitride or a silicon carbide. Such low k or ultra-low k dielectric materials are known in the art and are particularly useful in dielectric layers of integrated circuits.

In accordance with an exemplary technique, end terminal recesses for the resistive element are patterned through the dummy layer 24 of the resistor structure 22. In an embodiment, the end terminal recesses for the resistive element are concurrently patterned through the dummy layer 24 of the resistor structure 22 along with removing the dummy layer 24 of one of the dummy gate electrode structures 18, 20 to form a gate electrode recess, although it is to be appreciated that step-wise patterning of the end terminal recesses and removal the dummy layer 24 of the dummy gate electrode structures 18, 20 could be conducted separately. Concurrent patterning enables the end terminal recesses for the resistive element to be efficiently formed without addition of fabrication stages because dummy gate pull is necessary to effectuate gate-last techniques for forming an integrated circuit. Further, the end terminal recesses may be concurrently patterned along with removing the dummy layer 24 of either the first dummy gate electrode structure 18 (which overlies the N-type well 16) or the second dummy gate electrode structure 20 (which overlies the P-type well 14), with subsequent filling of the end terminal recesses with the same material that is employed to fill the gate electrode recesses to form end terminals and gate electrodes, respectively. Types of materials employed for the end terminals impacts resistance of the resulting resistance element. In this regard, the integrated circuits formed in accordance with the techniques described herein may be offered with resistance elements having two different resistances based upon different materials that are ultimately employed to form the respective gate electrodes that overlie the N-type well 16 or the P-type well 14.

Figure 3:
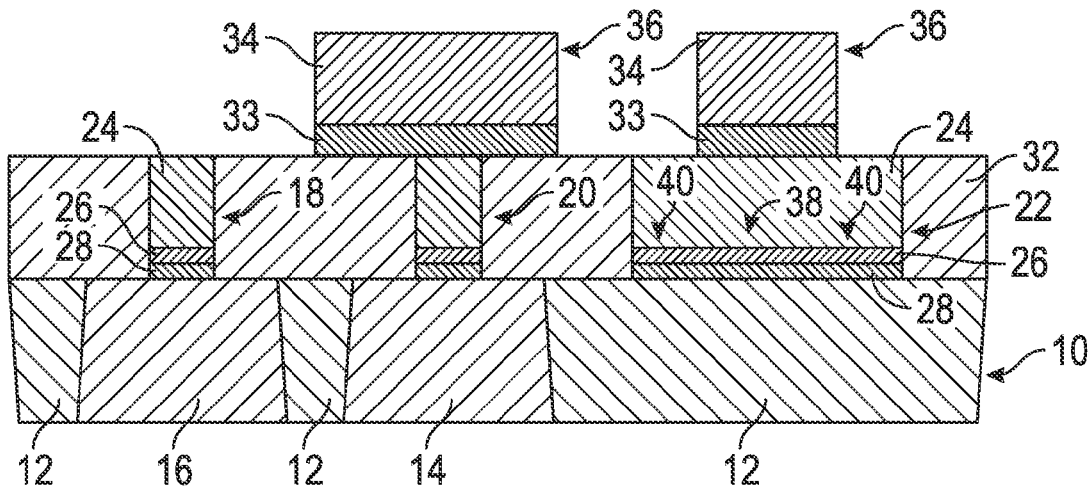
Figure 4:
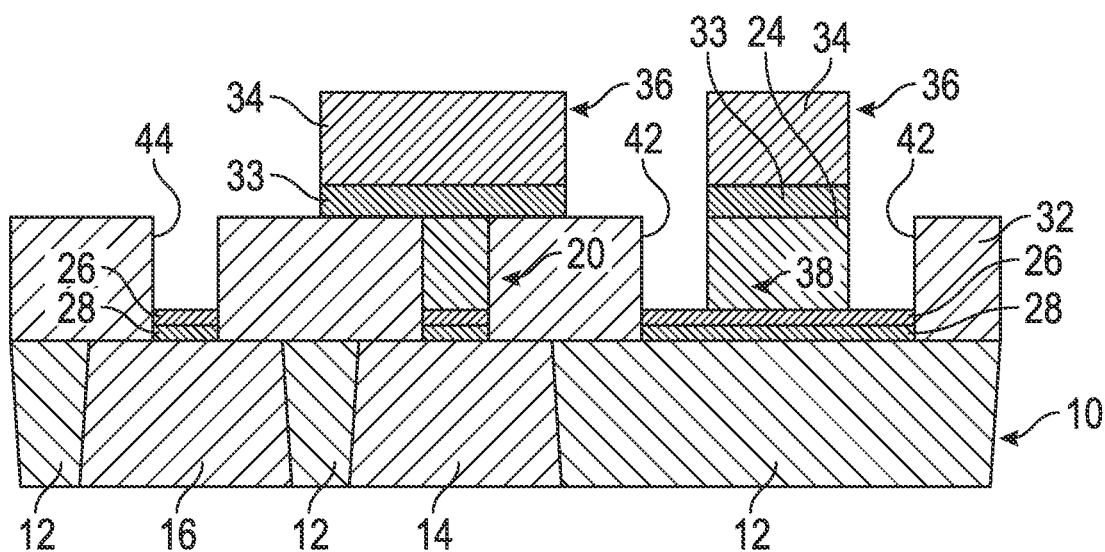
Figure 5:
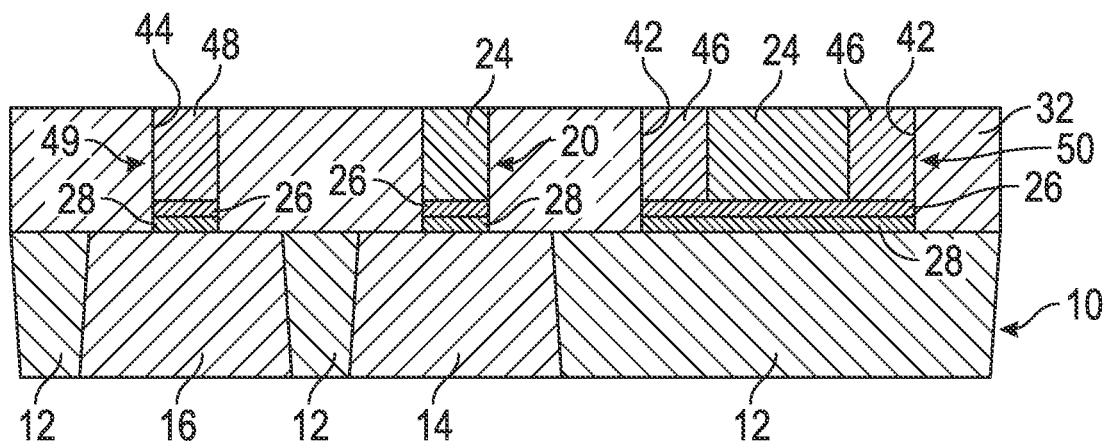

In an embodiment and referring to FIGS. 3-5, concurrent patterning of end terminal recesses and removal of the dummy layer of the first dummy gate electrode structure 18 is illustrated, with the dummy layer 24 of the second dummy gate electrode structure 20 remaining in place. In this embodiment and referring to FIG. 3, a first hard mask 33 may be formed overlying the interlayer dielectric layer 32 and overlying the dummy layer 24, and a photoresist film 34 may be deposited overlying the first hard mask 33. The photoresist film 34 may be patterned to remove portions of the photoresist film 34 overlying the first dummy gate electrode structure 18 and to further remove portions of the photoresist film 34 overlying portions of the resistor structure 22 where end terminals are to be formed, and the pattern of the photoresist film 34 may be transferred into the first hard mask 33 to form a first mask 36. In this embodiment, the second dummy gate electrode structure 20 is masked with the first mask 36, with the first dummy gate electrode structure 18 remaining unmasked. Further, a first region 38 of the resistor structure 22 is masked with the first mask 36, with second regions 40 of the resistor structure 22 on either side of the first region 38 remaining unmasked. In this regard, the unmasked first dummy gate electrode structure 18 and the second regions 40 of the resistor structure 22 may be subject to dummy layer removal, as set forth in further detail below, with the second dummy gate electrode structure 20 masked from etchants that are employed to remove the dummy layer 24 of the first dummy gate electrode structure 18 and the second regions 40 of the resistor structure 22. In this embodiment, the first dummy gate electrode structure 18 is disposed over the N-type well 16. As such, in accordance with this embodiment, the first mask 36 is employed during gate formation for P-type field effect transistors (PFETs), while also being employed for patterning end terminal recesses.

After forming the first mask 36 and referring to FIG. 4, portions of the dummy layer 24 in the second regions 40 are removed to form end terminal recesses 42, with the metal capping layer 26 exposed in the end terminal recesses 42. In embodiments, and as alluded to above, the dummy layer of the first dummy gate electrode structure is concurrently removed along with removal of the second regions of the dummy layer in the resistor structure 22, and removal of the dummy layer of the first dummy gate electrode structure forms a first gate electrode recess 44. The dummy layer may be removed through etching using a conventional etchant that is selective to polysilicon over material of the interlayer dielectric layer 32, such as silicon oxide formed through high density plasma deposition. An example of a suitable etchant for the polysilicon in the dummy layer is chlorine-based plasma. In an embodiment and referring to FIG. 5, the first mask is removed after concurrently patterning end terminal recesses 42 and after removing the dummy layer of the first dummy gate electrode structure to form the first gate electrode recess 44. As also shown in FIG. 5, metal gate material is deposited in the end terminal recesses 42 and the first gate electrode recess 44 after removing the first mask to form end terminals 46 for a resistance element 50 and a first gate electrode 48, respectively. The metal gate material may be deposited by forming one or more layers of electrically-conductive material in the first gate electrode recess 44, in the end terminal recesses 42, and overlying the interlayer dielectric layer 32 in accordance with conventional electrode formation through gate-last replacement metal gate techniques. Electrically-conductive material that is disposed over the interlayer dielectric layer 32 outside of the first gate electrode recess 44 and the end terminal recesses 42 may be removed through chemical mechanical polishing, resulting in formation of the first gate electrode 48 and the end terminals 46 as shown in FIG. 5. The end terminals 46 are disposed in electrical communication with the metal capping layer 26 to form the resistance element 50. The gate electrode 48 is disposed in electrical communication with the metal capping layer 26 to form a first gate electrode structure 49.

In an embodiment, metal gate material is deposited in the first gate electrode recess 44 and the end terminal recesses 42 that is either P-work function material or N-work function material, with the specific type of metal gate material dependent upon the type of transistor to be formed. In particular, the "P-work function material" and "N-work function material" refer to metal gate materials that have appropriate work function for PFETs or NFETs, respectfully. In the embodiment of FIG. 5, a P-work function material is deposited in the first gate electrode recess 44 and the end terminal recesses 42 because the first gate electrode 48 is formed overlying the N-type well 16, resulting in formation of a PFET. In embodiments, suitable P-work function materials used for PFET gate electrodes have a work function of about 5 eV. Examples of suitable P-work function materials include, but are not limited to, tungsten, tungsten nitride, molybdenum nitride and molybdenum aluminum nitride. Although FIG. 5 only shows a block of material for the first gate electrode 48 and the end terminals 46, it is to be appreciated that the first gate electrode 48 and the end terminals 46 may include a layer of the P-work function material and one or more other layers in accordance with convention gate-last replacement metal gate techniques.

Figure 6:
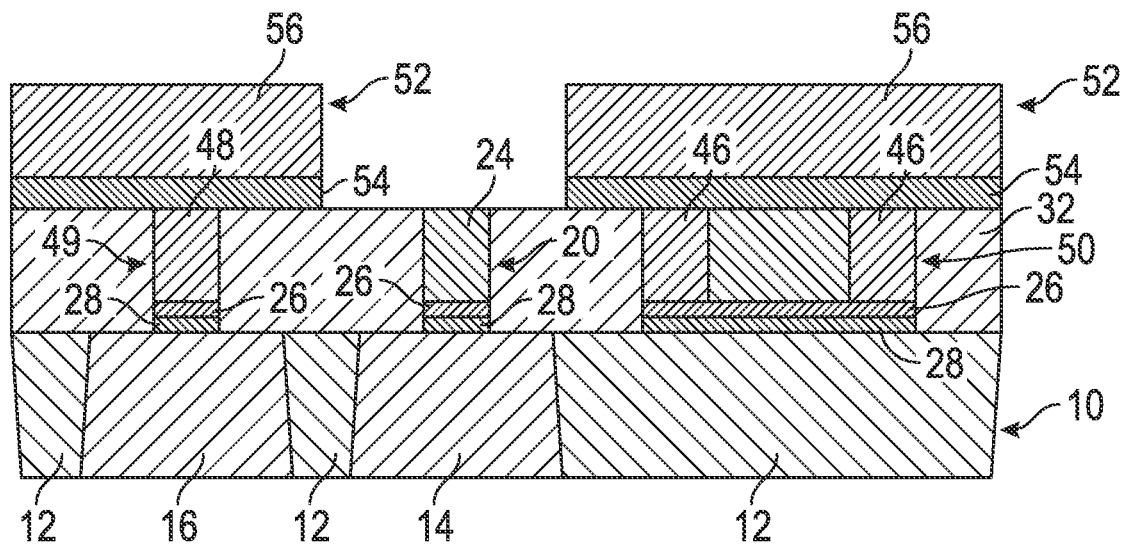
Figure 7:
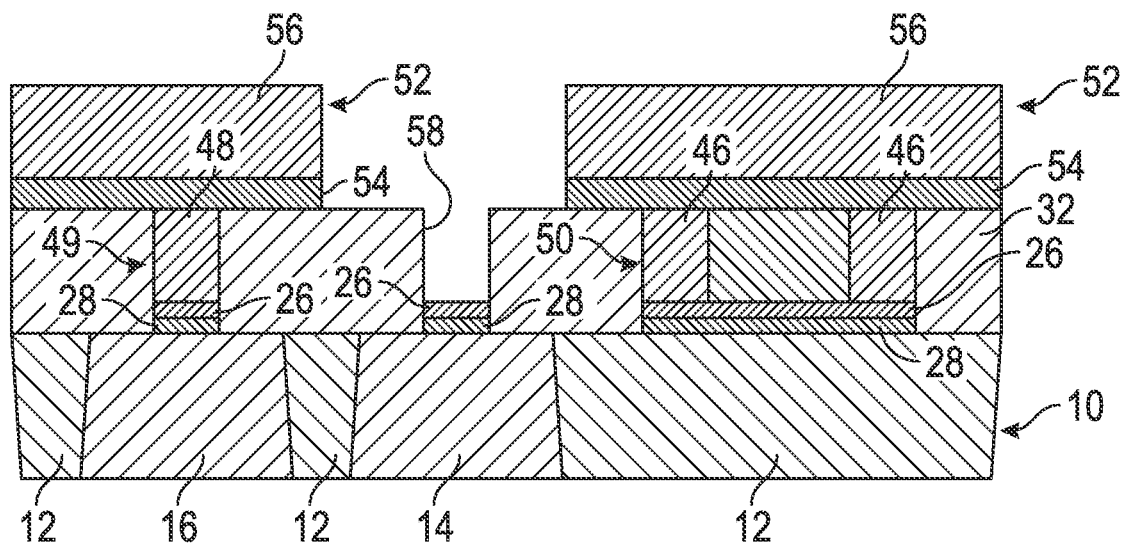
Figure 8:
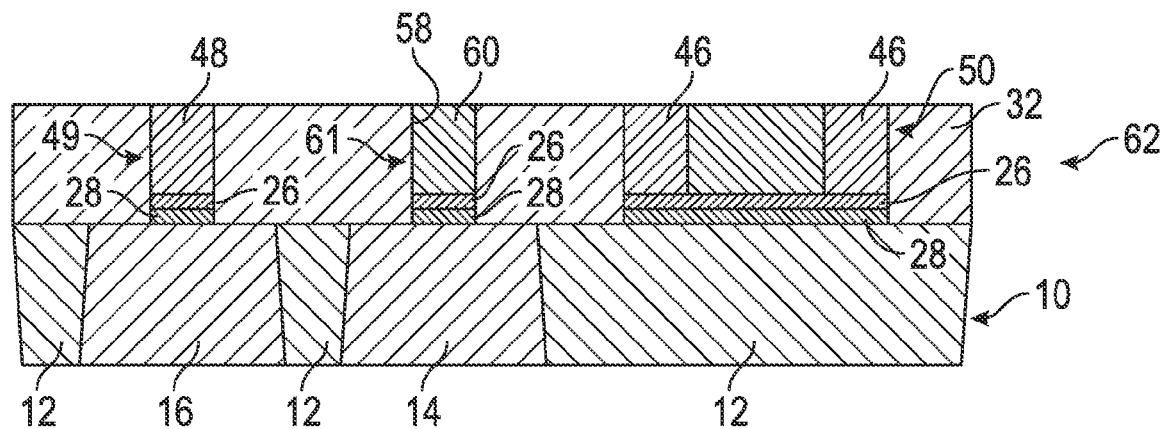

In an embodiment and as shown in FIGS. 6-8, additional gate electrodes may be formed through similar patterning/dummy gate removal/electrode recess fill techniques as described above. In this embodiment, the second dummy gate electrode structure 20 is disposed over the P-type well 14, and an N-type field effect transistor (NFET) is ultimately formed. In particular, the dummy layer 24 of the second dummy gate electrode structure 20 may be removed to form a second gate electrode recess after depositing the metal gate material in the end terminal recesses and the first gate electrode recess, followed by depositing electrically-conductive material in the second gate electrode recess to form a second gate electrode. Referring to FIG. 6, the first gate electrode 48 and the end terminals 46 of the resistance element 50 are masked with a second mask 52, with the second dummy gate electrode structure 20 remaining unmasked. In an embodiment and referring to FIG. 6, a second hard mask 54 may be formed overlying the interlayer dielectric layer 32 and overlying the first gate electrode 48 and the end terminals 46, and a second photoresist film 56 may be deposited overlying the second hard mask 54. The second photoresist film 56 may be patterned to remove portions of the second photoresist film 56 overlying the second dummy gate electrode structure 20, and the pattern of the second photoresist film 56 may be transferred into the second hard mask 54 to form the second mask 52. The unmasked second dummy gate electrode structure 20 may be subject to dummy layer removal as described above, with the first gate electrode 48 and the end terminals 46 masked from etchants that are employed to remove the dummy layer 24 of the second dummy gate electrode structure 20.

After forming the second mask 52 and referring to FIG. 7, portions of the dummy layer 24 in the second dummy gate electrode structure are removed to form a second gate electrode recess 58. The dummy layer may be removed through the same etching techniques as described above for removing the dummy layer from the first dummy gate electrode structure. In an embodiment and referring to FIG. 8, the second mask is removed after removing the dummy layer of the second dummy gate electrode structure to form the second gate electrode recess 58. As also shown in FIG. 8, metal gate material is deposited in the second gate electrode recess 58 after removing the second mask to form a second gate electrode 60, respectively. The second gate electrode 60 is disposed in electrical communication with the metal capping layer 26 to form a second gate electrode structure 61. The metal gate material may be deposited by forming one or more layers of electrically-conductive material in the second gate electrode recess 58 and overlying the interlayer dielectric layer 32 in accordance with conventional electrode formation through gate-last replacement metal gate techniques. Electrically-conductive material that is disposed over the interlayer dielectric layer 32 outside of the second gate electrode recess 58 and the end terminal recesses 42 may be removed through chemical mechanical polishing, resulting in formation of the second gate electrode 60 as shown in FIG. 8.

In the embodiment of FIG. 8, an N-work function material is deposited in the second gate electrode recess 58 because the second gate electrode 60 is formed overlying the P-type well 14, resulting in formation of an N-type field effect transistor (NFET). In embodiments, suitable N-work function materials have a work function of about 4.1 eV. Examples of suitable N-work function materials include, but are not limited to, aluminum, titanium aluminum nitride, and tantalum carbide. Although FIG. 8 only shows a block of material for the second gate electrode 60, it is to be appreciated that the second gate electrode 60 may include a layer of the N-work function material and one or more other layers in accordance with convention gate-last replacement metal gate techniques.

A resulting integrated circuit 62, as shown in FIG. 8, include the first gate electrode 48 as part of a PFET and the second gate electrode 60 as part of an NFET, and also includes the resistance element 50 disposed over the STI structure 12. The metal capping layer 26 of the resistance element 50 and the metal capping layer 26 of the gate electrodes 48, 60 include the same material, and the metal capping layer 26 of the resistance element 50 functions as a resistance layer in the final integrated circuit 62. While thickness of the metal capping layer 26 impacts resistance in the resistance element 50, thickness of the metal capping layer 26 is generally constrained by work function requirements of the gate electrodes. In this embodiment, the end terminals 46 include the same metal gate material as the first gate electrode 48, and the material of the end terminals 46 also impacts resistance of the resistance element 50. In another embodiment and as described in further detail below, the end terminals may be formed to include the same metal gate material as the second gate electrode 60, and the metal gate material of the second gate electrode 60 has different resistance properties than the metal gate material of the first gate electrode 48. As a result, two different options for establishing resistance of the resistance element 50 may be provided.

Figure 9:
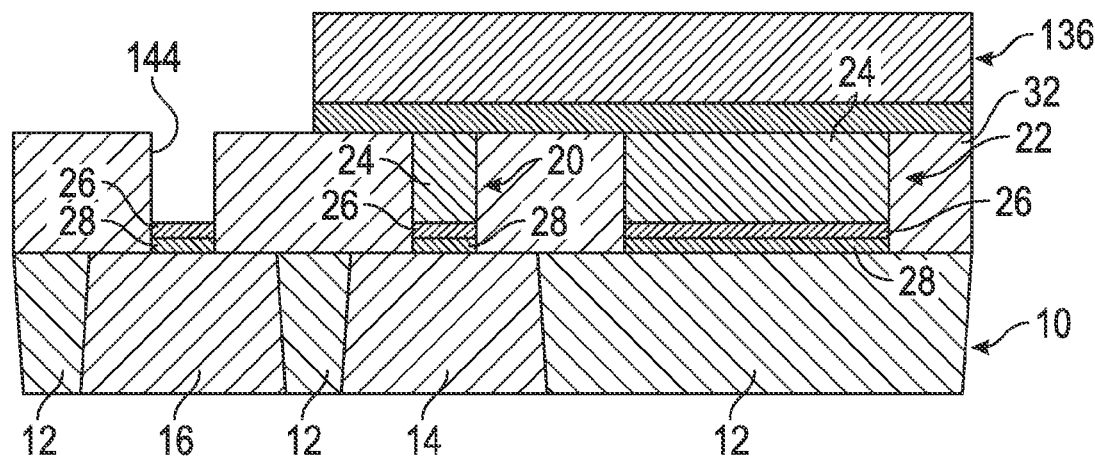
FIGS. 9-11 illustrate, in cross section, another gate-last technique for forming an integrated circuit including a resistance element in accordance with another exemplary embodiment.
Figure 10:
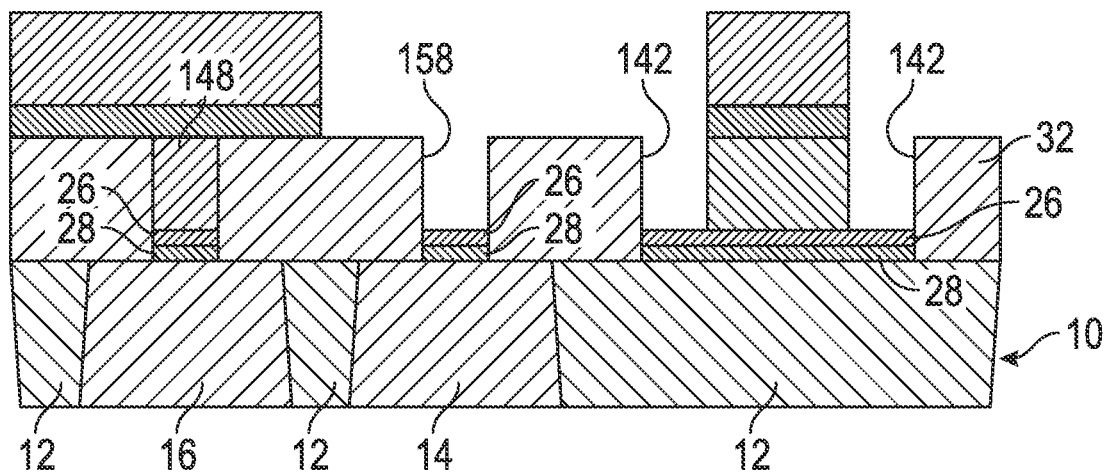
Figure 11:
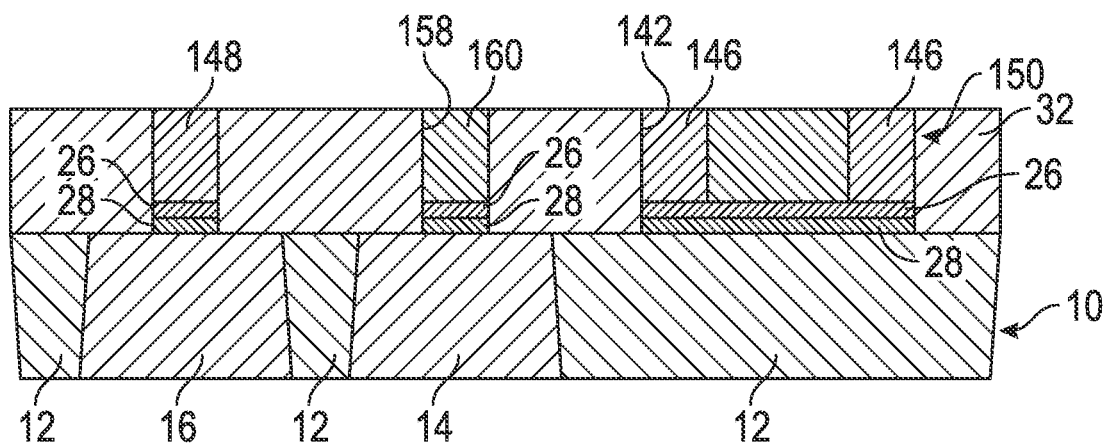

Referring to FIGS. 9-11, another embodiment of a gate-last technique for forming an integrated circuit including a resistance element will now be described. The technique of this embodiment is similar to the technique described above with reference to FIGS. 1-8, except that the end terminals include N-work function material instead of P-work function material. In this embodiment and referring to FIG. 9, the second dummy gate electrode structure 20 and the resistor structure 22 are masked with the first mask 136, with the first dummy gate electrode structure remaining unmasked. The dummy layer of the first dummy gate electrode structure is removed to form a first gate electrode recess 144. The first mask 136 is removed after forming the first gate electrode recess 144. In this embodiment, the first dummy gate electrode structure overlies the N-type well 16, and P-work function material is deposited in the first gate electrode recess 144 to form a first gate electrode before forming the end terminals of the resistance element. Referring to FIG. 10, after forming the first gate electrode 148, end terminal recesses 142 are concurrently patterned along with removing the dummy layer of the second dummy gate electrode structure to form a second gate electrode recess 158. Referring to FIG. 11, after forming the end terminal recesses 142 and the second gate electrode recess 158, N-work function material is deposited in the second gate electrode recess 158 and the end terminal recesses 142 to form a second gate electrode 160 and end terminals 146, respectively. As a result, in this embodiment, a resistance element 150 is formed that includes the end terminals 146 that include N-work function material.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A gate-last technique for forming an integrated circuit including a resistance element, the technique comprising:
providing a semiconductor substrate including a shallow trench isolation structure disposed therein;
patterning a dummy gate electrode structure overlying semiconductor material of the semiconductor substrate and a resistor structure overlying the shallow trench isolation structure, wherein the dummy gate electrode structure and the resistor structure comprise a dummy layer overlying a metal capping layer and a gate dielectric layer underlying the metal capping layer;
forming an interlayer dielectric layer overlying the semiconductor substrate and the shallow trench isolation structure, between the dummy gate electrode structure and the resistor structure;
concurrently patterning end terminal recesses for the resistance element through the dummy layer of the resistor structure and removing the dummy layer of the dummy gate electrode structure to form a gate electrode recess, wherein concurrently patterning the end terminal recesses and removing the dummy layer of the dummy gate electrode structure comprises masking a first region of the resistor structure with a first mask, wherein entire second regions of the resistor structure on either side of the first region remain unmasked and wherein portions of the interlayer dielectric layer adjacent to the second regions also remain unmasked; and
depositing metal gate material in the end terminal recesses and the gate electrode recess to form end terminals for the resistance element and a gate electrode, respectively.

2. The technique of claim 1, wherein concurrently patterning the end terminal recesses and removing the dummy layer of the dummy gate electrode structure comprises removing portions of the dummy layer in the second regions to form the end terminal recesses with the metal capping layer exposed in the end terminal recesses.

3. The technique of claim 1, wherein the semiconductor substrate comprises a P-type well and an N-type well, and wherein patterning the dummy gate electrode structure comprises patterning a first dummy gate electrode structure overlying the N-type well and a second dummy gate electrode structure overlying the P-type well.

4. The technique of claim 3, wherein concurrently patterning the end terminal recesses and removing the dummy layer of the dummy gate electrode structure comprises concurrently patterning the end terminal recesses and removing the dummy layer of the first dummy gate electrode structure to form a first gate electrode recess, with the dummy layer of the second dummy gate electrode structure remaining in place.

5. The technique of claim 4, wherein concurrently patterning the end terminal recesses and removing the dummy layer of the dummy gate electrode structure comprises masking the second dummy gate electrode structure with a first mask, with the first dummy gate electrode structure remaining unmasked.

6. The technique of claim 5, wherein concurrently patterning the end terminal recesses and removing the dummy layer of the dummy gate electrode structure comprises masking a first region of the resistor structure with the first mask, wherein second regions of the resistor structure on either side of the first region remain unmasked.

7. The technique of claim 6, further comprising removing the first mask after concurrently patterning the end terminal recesses and after removing the dummy layer of the first dummy gate electrode structure, wherein the metal gate material is deposited in the end terminal recesses and the first gate electrode recess after removing the first mask to form the end terminals for the resistance element and a first gate electrode.

8. The technique of claim 7, wherein depositing the metal gate material in the end terminal recesses and the first gate electrode recess comprises depositing P-work function material in the end terminal recesses and the first gate electrode recess.

9. The technique of claim 7, further comprising removing the dummy layer of the second dummy gate electrode structure after depositing the metal gate material in the end terminal recesses and the first gate electrode recess to form a second gate electrode recess.

10. The technique of claim 9, wherein removing the dummy layer of the second dummy gate electrode structure comprises masking the first gate electrode and the end terminals of the resistance element with a second mask, with the second dummy gate electrode structure remaining unmasked.

11. The technique of claim 10, further comprising removing the second mask after removing the dummy layer of the second dummy gate electrode structure and depositing N-work function material in the second gate electrode recess.

12. The technique of claim 3, further comprising masking the second dummy gate electrode structure and the resistor structure with a first mask, with the first dummy gate electrode structure remaining unmasked, and removing the dummy layer of the first dummy gate electrode structure to form a first gate electrode recess.

13. The technique of claim 12, further comprising removing the first mask after removing the dummy layer of the first dummy gate electrode structure, wherein P-work function material is deposited in the first gate electrode recess after removing the first mask to form a first gate electrode.

14. The technique of claim 13, wherein concurrently patterning the end terminal recesses and removing the dummy layer of the dummy gate electrode structure comprises concurrently patterning the end terminal recesses and removing the dummy layer of the second dummy gate electrode structure to form a second gate electrode recess after forming the first gate electrode.

15. The technique of claim 14, wherein concurrently patterning the end terminal recesses and removing the dummy layer of the dummy gate electrode structure comprises masking the first gate electrode with a second mask and masking a first region of the resistor structure with the second mask, wherein second regions of the resistor structure on either side of the first region remain unmasked and wherein the second dummy gate electrode structure remains unmasked.

16. The technique of claim 15, further comprising removing the second mask after concurrently patterning the end terminal recesses and after removing the dummy layer of the second dummy gate electrode structure, wherein the metal gate material is deposited in the end terminal recesses and the second gate electrode recess after removing the second mask to form the end terminals for the resistance element and a second gate electrode.

17. The technique of claim 16, wherein depositing the metal gate material in the end terminal recesses and the second gate electrode recess comprises depositing N-work function material in the end terminal recesses and the second gate electrode recess.

18. A gate-last technique for forming an integrated circuit including a resistance element, the technique comprising:
providing a semiconductor substrate comprising a P-type well, an N-type well, and a shallow trench isolation structure disposed therein;
patterning a first dummy gate electrode structure overlying the N-type well, a second dummy gate electrode structure overlying the P-type well, and a resistor structure overlying the shallow trench isolation structure, wherein the first dummy gate electrode structure, the second dummy gate electrode structure, and the resistor structure comprise a dummy layer overlying a metal capping layer and a gate dielectric layer underlying the metal capping layer;
forming an interlayer dielectric layer overlying the semiconductor substrate and the shallow trench isolation structure, between the first dummy gate electrode structure and the second dummy gate electrode structure and between the dummy gate electrode structures and the resistor structure;
masking a first region of the resistor structure with a first mask, wherein entire second regions of the resistor structure on either side of the first region remain unmasked and wherein portions of the interlayer dielectric layer adjacent to the second regions also remain unmasked;
removing portions of the dummy layer in the second regions to form the end terminal recesses with the metal capping layer exposed in the end terminal recesses;
removing the dummy layer of one of the first dummy gate electrode structure or the second dummy gate electrode structure to form a gate electrode recess; and
depositing a first metal gate material in the end terminal recesses and the gate electrode recess to form end terminals for the resistance element and a gate electrode, respectively.

* * * * *